(12) United States Patent
Wang et al.

(10) Patent No.: US 8,803,247 B2
(45) Date of Patent: Aug. 12, 2014

(54) FIN-TYPE FIELD EFFECT TRANSISTOR

(75) Inventors: Chih-Jung Wang, Hsinchu (TW); Tong-Yu Chen, Hsinchu (TW)

(73) Assignee: United Microelectronics Corporation, Hsinchu (TW)

( * ) Notice: Subject to any disclaimer, the term of this patent is extended or adjusted under 35 U.S.C. 154(b) by 0 days.

(21) Appl. No.: 13/326,429

(22) Filed: Dec. 15, 2011

(65) Prior Publication Data

US 2013/0154028 A1    Jun. 20, 2013

(51) Int. Cl.
*H01L 27/148* (2006.01)
*H01L 29/66* (2006.01)
*H01L 29/00* (2006.01)
*H01L 27/088* (2006.01)
*H01L 21/339* (2006.01)
*H01L 21/00* (2006.01)
*H01L 21/84* (2006.01)
*H01L 21/338* (2006.01)
*H01L 21/337* (2006.01)
*H01L 21/336* (2006.01)
*H01L 21/8234* (2006.01)

(52) U.S. Cl.
USPC .......... 257/400; 257/240; 257/241; 257/269; 257/286; 257/287; 257/398; 257/399; 257/401; 438/147; 438/157; 438/176; 438/195; 438/197; 438/283

(58) Field of Classification Search
USPC ....................................... 438/197
See application file for complete search history.

(56) References Cited

U.S. PATENT DOCUMENTS

| | | | |
|---|---|---|---|
| 5,428,237 A * | 6/1995 | Yuzurihara et al. | 257/349 |
| 6,043,138 A | 3/2000 | Ibok | |
| 6,492,216 B1 | 12/2002 | Yeo et al. | |
| 6,921,963 B2 | 7/2005 | Krivokapic et al. | |
| 7,087,477 B2 | 8/2006 | Fried et al. | |
| 7,091,551 B1 | 8/2006 | Anderson et al. | |
| 7,247,887 B2 | 7/2007 | King et al. | |
| 7,250,658 B2 | 7/2007 | Doris et al. | |
| 7,309,626 B2 | 12/2007 | Ieong et al. | |
| 7,352,034 B2 | 4/2008 | Booth, Jr. et al. | |
| 7,470,570 B2 | 12/2008 | Beintner et al. | |
| 7,531,437 B2 | 5/2009 | Brask et al. | |
| 7,569,857 B2 | 8/2009 | Simon et al. | |
| 7,888,750 B2 | 2/2011 | Anderson et al. | |
| 7,902,035 B2 | 3/2011 | Yu et al. | |
| 2004/0195624 A1 | 10/2004 | Liu et al. | |
| 2005/0051825 A1 | 3/2005 | Fujiwara et al. | |
| 2006/0099830 A1 | 5/2006 | Walther et al. | |
| 2006/0286729 A1 | 12/2006 | Kavalieros et al. | |
| 2007/0026629 A1 * | 2/2007 | Chen et al. | 438/424 |
| 2007/0108528 A1 | 5/2007 | Anderson et al. | |
| 2007/0122953 A1 * | 5/2007 | Liu et al. | 438/187 |
| 2007/0158756 A1 | 7/2007 | Dreeskornfeld et al. | |

(Continued)

*Primary Examiner* — Mamadou Diallo
*Assistant Examiner* — Jay C Chang
(74) *Attorney, Agent, or Firm* — Ding Yu Tan

(57) ABSTRACT

A fin-type field effect transistor including at least one fin-type semiconductor structure, a gate strip and a gate insulating layer is provided. The fin-type semiconductor structure is doped with a first type dopant and has a block region with a first doping concentration and a channel region with a second doping concentration. The first doping concentration is larger than the second doping concentration. The blocking region has a height. The channel region is configured above the blocking region. The gate strip is substantially perpendicular to the fin-type semiconductor structure and covers above the channel region. The gate insulating layer is disposed between the gate strip and the fin-type semiconductor structure.

7 Claims, 5 Drawing Sheets

(56) References Cited

U.S. PATENT DOCUMENTS

| | | |
|---|---|---|
| 2008/0157208 A1 | 7/2008 | Fischer et al. |
| 2008/0203491 A1* | 8/2008 | Anderson et al. ............. 257/372 |
| 2009/0124097 A1 | 5/2009 | Cheng |
| 2009/0242964 A1 | 10/2009 | Akil et al. |
| 2009/0269916 A1 | 10/2009 | Kang et al. |
| 2010/0048027 A1 | 2/2010 | Cheng et al. |
| 2010/0072553 A1 | 3/2010 | Xu et al. |
| 2010/0144121 A1 | 6/2010 | Chang et al. |
| 2010/0167506 A1 | 7/2010 | Lin et al. |
| 2011/0042748 A1* | 2/2011 | Anderson et al. ............. 257/365 |

* cited by examiner

FIN-TYPE FIELD EFFECT TRANSISTOR

BACKGROUND

1. Technical Field

The present invention generally relates to a semiconductor element and more particularly to a fin-type field effect transistor.

2. Description of the Related Art

With the reduction of line width in metal oxide semiconductor (MOS) fabrication, leakage current in areas between the source and the drain away from the gate is increasingly significant. Although the leakage current can be reduced through a reduction in the thickness of the gate dielectric layer, it is no longer effective when the line width drops to 0.1 micrometer or below. To deal with this problem, Professor Chenming Hu of the University of California at Berkley has proposed two methods. The first method is to use an extremely thin first doping type semiconductor substrate to fabricate MOSFET so that the substrate no longer has an area away from the gate and hence a leakage current no longer exists. The second method is to use a double gate strip. A gate dielectric layer in the double gate strip surrounds the channel region so that the entire channel region is subjected to the influence of the gate electric field. Ultimately, the on current of the device is increased and the leakage current is reduced.

A fin-type field effect transistor (FinFET) that combines the two aforementioned concepts is provided. During the manufacturing process of the conventional FinFET, a plurality of trenches are formed on a doped silicon substrate to form a plurality of fin-type structures between the trenches. Or, a doped silicon layer is patterned to form the fin-type structures. Then, a gate insulating layer and a gate strip are formed on the fin-type structures to form a FinFET. The two ends of each fin-type structures are doped as a source region and a drain region of the FinFET. The portions of the fin-type structures are channel region of the FinFET. Accordingly, the channel widths of the FinFET are relative to the heights of the fin-type structures. For example, in double-gate FinFET, the channel width is equal to twice of the height of the fin-type structure; in tri-gate FinFET, the channel width is equal to twice of the height of the fin-type structure plus the width of the top of the fin-type structure.

However, the fin-type structures of the conventional FinFET all have the same height because of the manufacturing factors, so that the channel width of the FinFET is only decided by reducing or increasing the number of the fin-type structures. Therefore, it is difficult to manufacture FinFETs with proper channel width for any requests.

BRIEF SUMMARY

Accordingly, the invention is directed to a fin-type field effect transistor has the channel width determined by the doping depth of a blocking region thereof.

The invention provides a fin-type field effect transistor including at least one fin-type semiconductor structure, a gate strip and a gate insulating layer is provided. The at least one fin-type semiconductor structure is doped with a first type dopant and has a block region with a first doping concentration and a channel region with a second doping concentration. The first doping concentration is larger than the second doping concentration. The blocking region has a height. The channel region is configured above the blocking region. The gate strip is substantially perpendicular to the at least one fin-type semiconductor structure and covers the channel region. The gate insulating layer is disposed between the gate strip and the at least one fin-type semiconductor structure.

In an embodiment of the invention, the fin-type field effect transistor further includes a source structure and a drain structure doped with a second type dopant respectively. The at least one fin-type semiconductor structure is connected between the source structure and the drain structure.

In an embodiment of the invention, the gate strip covers the at least one fin-type semiconductor structure conformally In an embodiment of the invention, the material of the gate strip is, for example, polysilicon.

In an embodiment of the invention, the fin-type field effect transistor includes a plurality of fin-type semiconductor structures substantially parallel to each other. The fin-type semiconductor structures have the same height but the blocking regions of the fin-type semiconductor structures have different heights.

In an embodiment of the invention, the fin-type field effect transistor further includes a semiconductor substrate with a plurality of trenches parallel to each other. Therefore, at least one fin-type semiconductor structure is taken shape between the adjacent trenches.

In an embodiment of the invention, the gate strip is evenly configured on the semiconductor substrate and filled into the trenches and covers a portion of the fin-type semiconductor structure.

In an embodiment of the invention, the fin-type field effect transistor further includes a plurality of insulating structures configured in the trenches. The gate strip is configured on the insulating structures.

In an embodiment of the invention, the at least one fin-type semiconductor structure further has a source structure and a drain structure respectively defined in two ends thereof. The channel region and the blocking region are defined between the source structure and the drain structure. The source structure and the drain structure are doped with a second type dopant respectively.

In an embodiment of the invention, the material of the planar gate strip is, for example, metal. The material of the gate insulating layer is, for example, dielectric material with high-K.

In an embodiment of the invention, the fin-type field effect transistor further includes an insulating layer configured on the top surface of the gate insulating layer and between the gate strip and the gate insulating layer.

The fin-type field effect transistor of the invention may include a plurality of fin-type semiconductor structures. The fin-type semiconductor structures have the same height but different depth and height of the blocking regions thereof formed by different doping intensities. Therefore, the fin-type semiconductor structures can provide different channel widths respectively to improve the flexibility of usage of the fin-type field effect transistor.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1A:
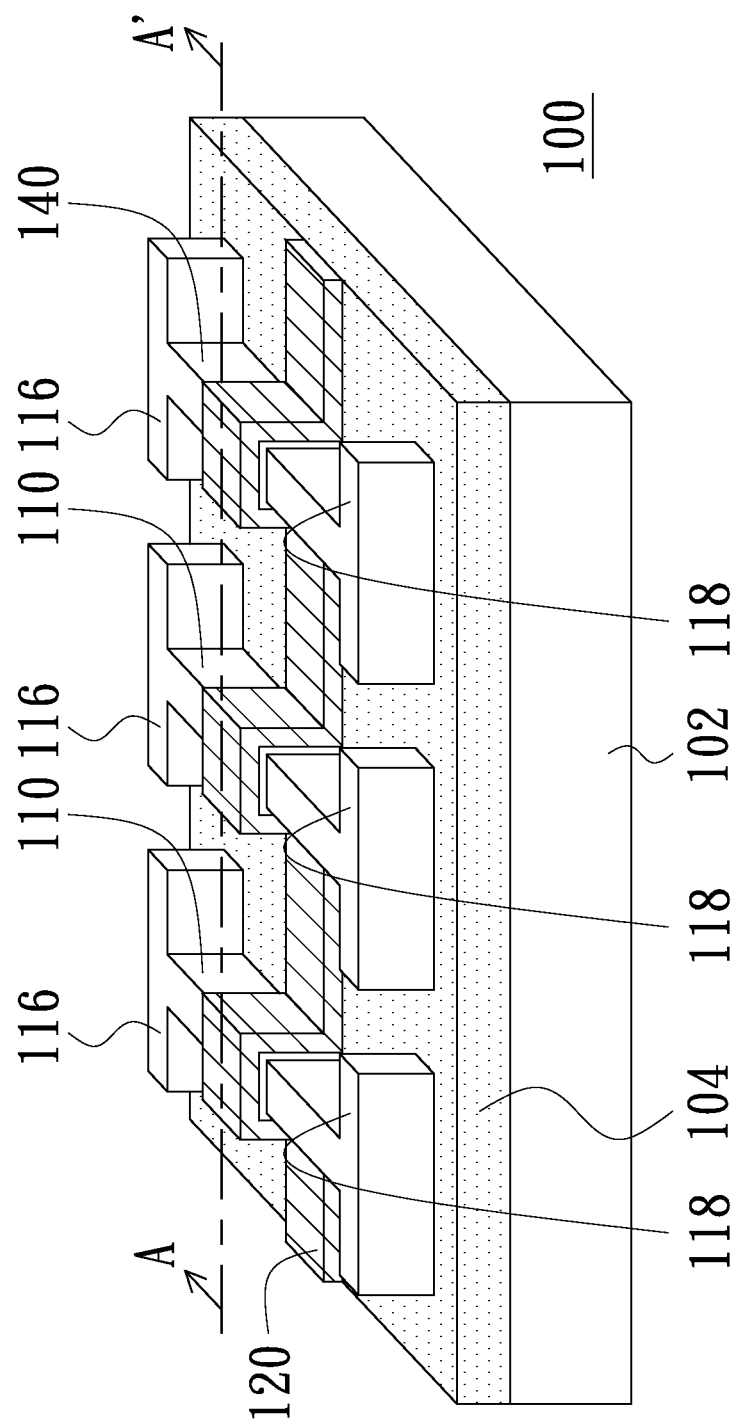
FIG. 1A is a schematic view illustrating a fin-type field effect transistor according to an embodiment of the invention.
Figure 1B:
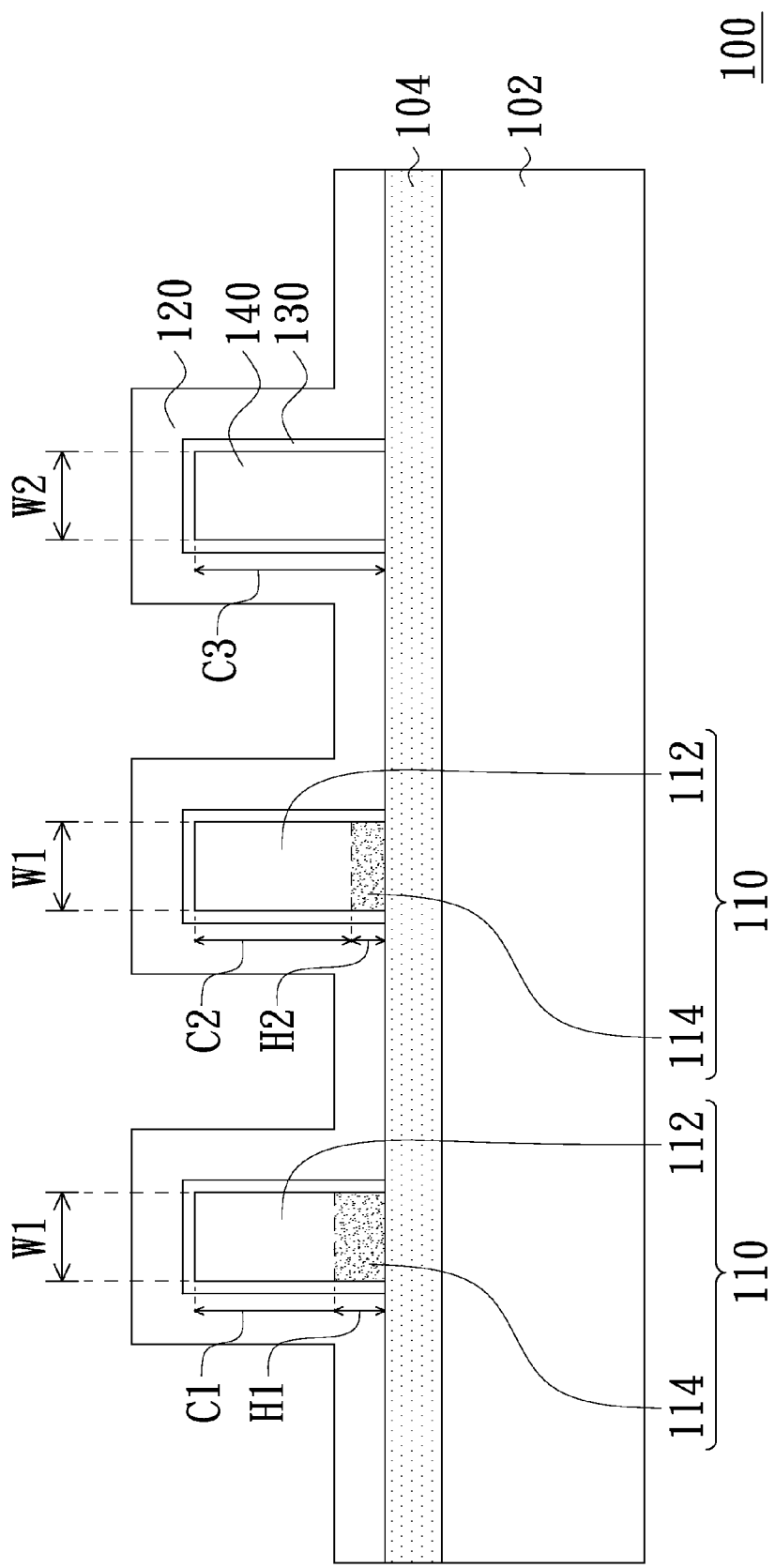
FIG. 1B is a cross-section view illustrating the fin-type field effect transistor along A-A' line shown in FIG. 1A.

FIG. 1A is a schematic view illustrating a fin-type field effect transistor according to an embodiment of the invention. FIG. 1B is a cross-section view illustrating the fin-type field effect transistor along A-A' line shown in FIG. 1A. Referring to FIG. 1A and FIG. 1B, the fin-type field effect transistor 100 includes a plurality of fin-type semiconductor structures 110, a gate strip 120 and a gate insulating layer 130. It should be noted that the number of the fin-type semiconductor structure 110 is not limited hereto. Although there are two fin-type semiconductor structures 110 with the same height shown in FIGS. 1A and 1B, the fin-type field effect transistor 100 may includes single or more than two fin-type semiconductor structure 110 in other embodiments.

The fin-type semiconductor structure 110 doped with a first type dopant has a channel region 112 and a blocking region 114. The blocking regions 114 of different fin-type semiconductor structures 110 have different heights H1 and H2 respectively. The channel region 112 is disposed above the blocking region 114. Furthermore, the blocking region 114 has a first doping concentration and the channel region 112 has a second doping concentration smaller than the first doping concentration.

Moreover, in this embodiment, the fin-type field effect transistor 100 further includes a source structure 116 and a drain structure 118 respectively doped with a second type dopant, and the fin-type semiconductor structure 110 is connected between the source structure 116 and the drain structure 118. In specific, the fin-type semiconductor structures 110 can be doped with p-type dopant and the source structure 116 and the drain structure 118 can be doped with n-type dopant to manufacture an n-type fin-type field effect transistor. On the other hand, the fin-type semiconductor structures 110 can be doped with n-type dopant and the source structure 116 and the drain structure 118 can be doped with p-type dopant to manufacture a p-type fin-type field effect transistor.

During the manufacturing process of the fin-type field effect transistor 100 of this embodiment, a substrate 102 is provided at first. Next, a dielectric layer 104 and a semiconductor layer (not shown) are formed on the substrate 102. The semiconductor layer and the dielectric layer 104 constitute, for example, a silicon on insulator (so-called SOI) wafer disposed on the substrate 102.

Next, the semiconductor layer is patterned to single or multi fin-type semiconductor structures 110, and the fin-type semiconductor structures 110 are doped with the first type dopant. Alternately, in other embodiments, the semiconductor layer also can be doped with the first type dopant firstly, and then the doped semiconductor layer is patterned to form single or multi doped fin-type semiconductor structures 110.

At the doping process, all the fin-type semiconductor structures 110 are doped with the first type dopant firstly, therefore each fin-type semiconductor structure 110 has the second doping concentration. Then, the doping process of fin-type semiconductor structures 110 is selectively performed at second time. During the second time doping process, the doping intensities performed for different fin-type semiconductor structures 110 are different. Therefore, the first type dopant with the second doping concentration is diffused as the blocking regions 114 in different depths for different fin-type semiconductor structures 110. The doping process of the source structure 116 and the drain structure 118 can be performed before or after forming the blocking regions 114.

In the fin-type field effect transistor 100 of this embodiment, the blocking regions 114 of different fin-type semiconductor structure 110 have different heights according the doping intensity of the first type dopant in the second time doping process. As shown in FIG. 1B, one of fin-type semiconductor structures 110 has the blocking region 114 with height H1 and another one has the blocking region 114 with height H2, so that the channel regions of the fin-type semiconductor structures 110 have different height, such as height C1 and height C2 show in FIG. 1B.

The gate strip 120 is substantially perpendicular to the fin-type semiconductor structures 110 and covers above the channel regions 112. In this embodiment, the gate strip 120 also covers the fin-type semiconductor structures 140. The gate insulating layer 130 is disposed between the gate strip 120 and the fin-type semiconductor structures 110. In this embodiment, the material of the gate strip 120 is, for example, polysilicon, and the gate strip 120 conformally covers the channel regions 112 of the fin-type semiconductor structures 110, but the invention is not limited hereto. In other embodiments, the gate strip 120 may evenly cover on the fin-type semiconductor structures 110.

In each fin-type semiconductor structures 110, since each blocking region 114 has the first doping concentration larger than the second doping concentration of the corresponding channel region 112, when the gate strip 120 is supplied a voltage, the electric carriers move from the source structure 116 to the drain structure 118 would pass through the channel region 112 above the blocking region 114. That is, the channel widths provided by the fin-type semiconductor structures 110 are relative to the height C1 and the height C2 of the channel regions 112.

Moreover, since the second time doping process with the first type dopant is performed alternately, the fin-type field effect transistor 100 of this embodiment may includes at least one fin-type semiconductor structure 140 without going through the second time doping process with the first type dopant, so that there is not blocking region 114 in the fin-type semiconductor structure 140. Accordingly, the channel width provided from the fin-type semiconductor structure 140 is relative to the total height C3 thereof.

In details, the fin-type field effect transistor 100 of this embodiment is, for example, a tri-gate fin-type field effect transistor, so that the channel width provided from each fin-type semiconductor structure 110 is equal to twice of the height of the channel region 112 plus the width W1 of the top of the channel region 112, and the channel width provided from the fin-type semiconductor structure 140 is equal to twice of the total height C3 and the width W2 of the top thereof. Accordingly, the heights of the blocking regions 114 would be determined according to the required channel width of the fin-type field effect transistor 100 in this embodiment. Thus, the channel width of the fin-type field effect transistor 100 can be determined flexibly even if the heights of all fin-type semiconductor structure 110 are the same.

Figure 2:
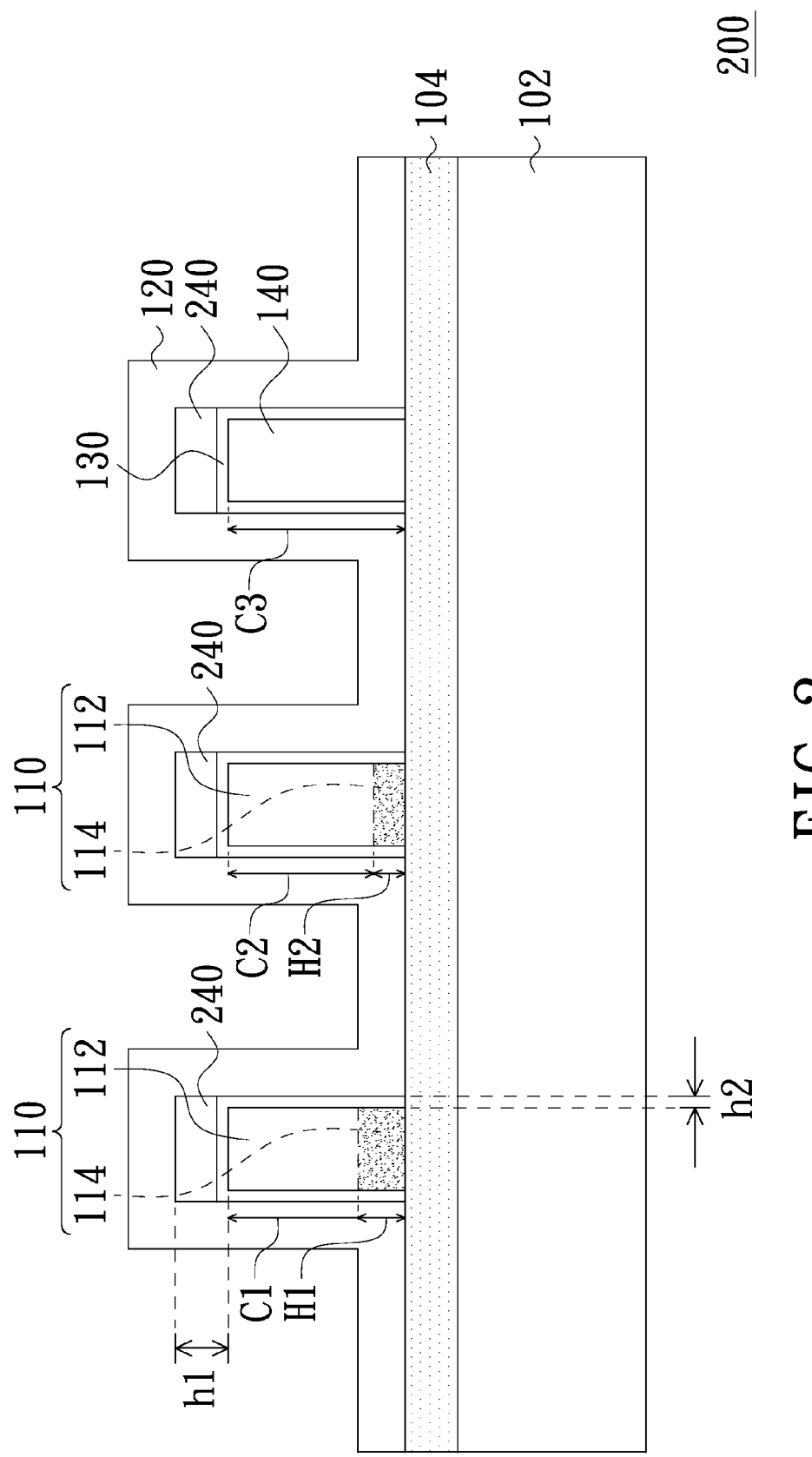
FIG. 2 is a cross-section view illustrating the fin-type field effect transistor according to another embodiment of the invention.

Referring to FIG. 2, in another embodiment, the fin-type field effect transistor 200 may be a double-gate fin-type field effect transistor. The fin-type field effect transistor 200 further includes an insulating layer 240 configured on the top surface of the gate insulating layer 130 and between the gate strip 120 and the gate insulating layer 130. In specifically, the insulating layer 240 may be formed with the gate insulating layer 130 in the same process. Otherwise, the insulating layer 240 also may be formed after forming the gate insulating layer 130.

In fin-type field effect transistor 200, since the distance h1 between the gate strip 120 and the top surface of the fin-type semiconductor structure 110/140 is larger than the distance h2 between the gate strip 120 and the sidewalls of the fin-type semiconductor structure 110/140, it is difficult to induce the current flowed from the source structure 116 through the top surface of the fin-type semiconductor structure 110/140 to the drain structure 118 by applying voltage on the gate strip 120. Therefore, the effective channel widths provided by each fin-type semiconductor structure 110 in this embodiment is equal to twice of the height of the channel region 112 and the effective channel width provided by the fin-type semiconductor structure 140 is equal to twice of the total height C3 thereof.

In the aforementioned embodiment, the fin-type semiconductor structures independent to each other are formed by patterning the semiconductor layer, but the invention is not limited hereto. In other embedment, the fin-type semiconductor structures can be parallel connected with each other. It would be described in detail in the following paragraphs.

Figure 3A:
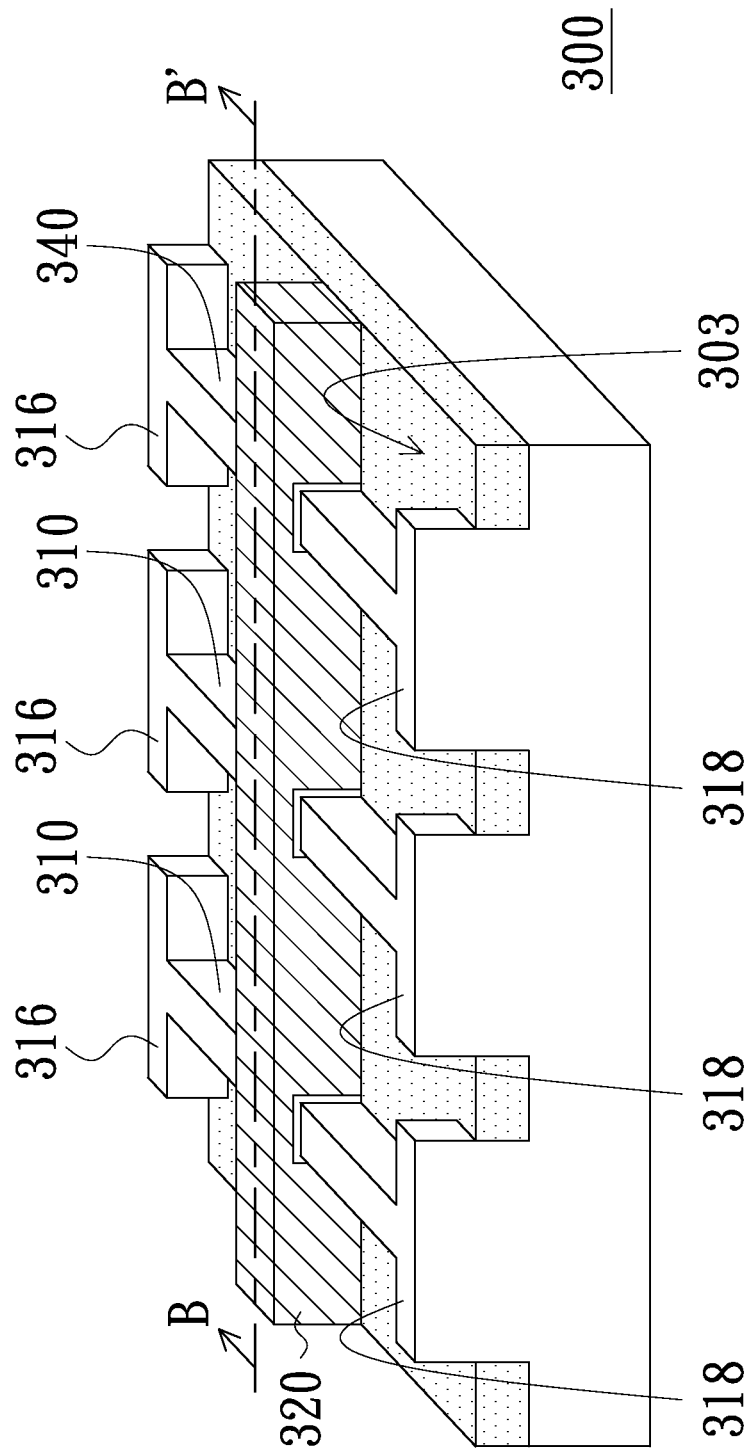
FIG. 3A is a schematic view illustrating a fin-type field effect transistor according to another embodiment of the invention.
Figure 3B:
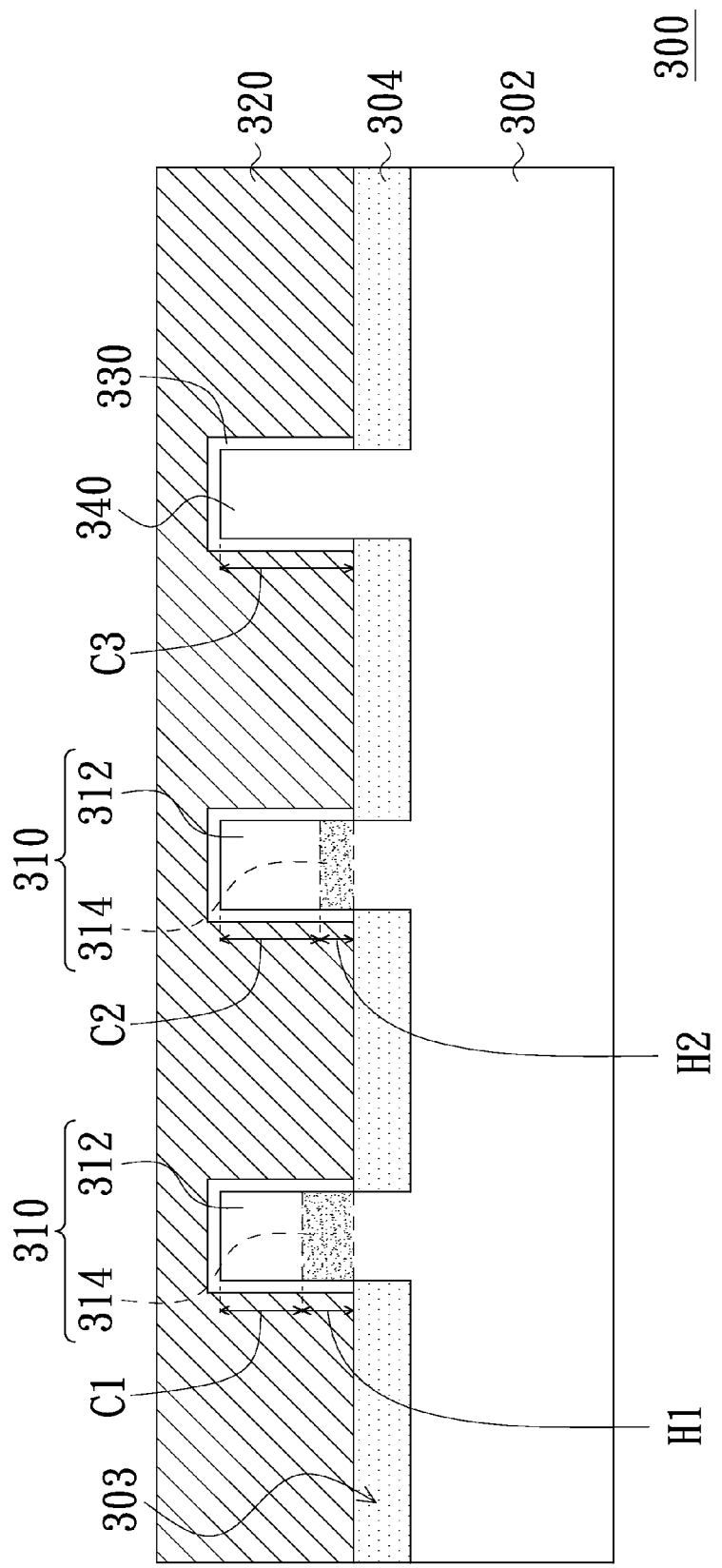
FIG. 3B is a cross-section view illustrating the fin-type field effect transistor along B-B' line shown in FIG. 3A.

FIG. 3A is a schematic view illustrating a fin-type field effect transistor according to another embodiment of the invention. FIG. 3B is a cross-section view illustrating the fin-type field effect transistor along B-B' line shown in FIG. 3A. Referring to FIG. 3A and FIG. 3B, the fin-type field effect transistor 300 is similar with the fin-type field effect transistor 100 of the aforementioned embodiment and the difference between the fin-type field effect transistor 300 and the fin-type field effect transistor 100 would be described in the following paragraphs.

The fin-type field effect transistor 300 includes a semiconductor substrate 302, a gate strip 320 and a gate insulating layer 330. The semiconductor substrate 302 has a plurality of trenches 303 parallel to each other. Therefore, a plurality of fin-type semiconductor structures 310 with the same height are taken shape between the adjacent trenches 303. Accordingly, the fin-type semiconductor structures 310 parallel connected with each other through the semiconductor substrate 302. Although there are only two fin-type semiconductor structures 310 with the same height shown in FIGS. 3A and 3B, the invention is not limited hereto. In other embodiments, the fin-type field effect transistor 300 may includes single or more than two fin-type semiconductor structures 310.

Each fin-type semiconductor structure 310 has a channel region 312 and a blocking region 314. Furthermore, one of the fin-type semiconductor structures 310 has the blocking region 314 with height H1 and the channel width C1. Another fin-type semiconductor structure 310 has the blocking region 314 with height H2 and the channel width C2. In specific, the method for forming the channel regions 312 and the blocking regions 314 is similar to or the same with the method for forming the channel regions 112 and the blocking regions 114. Moreover, the fin-type field effect transistor 300 further includes a source structure 316 and a drain structure 318 respectively similar to or the same with the source structure 116 and the drain structure 118 of aforementioned embodiment.

The gate strip 320 is evenly configured on the semiconductor substrate 302 and perpendicular with the fin-type semiconductor structure 310. Also, the gate strip 320 covers the channel regions 312 of the fin-type semiconductor structures 310 and the trenches 303 is filled up therewith. That is, the top surface of the planar gate strip 320 is uniform at a horizontal and higher than the top surface of the fin-type semiconductor structure 310. In other embodiment, the gate strip 320 may conformally cover the channel regions 312 of the fin-type semiconductor structures 310 and the trenches 303 are filled therewith, but the invention is not limited hereto.

The gate insulating layer 330 is disposed between the gate strip 320 and the fin-type semiconductor structures 310. In this embodiment, the material of the planar gate strip 320 is, for example, metal, such as titanium aluminum alloy. The material of the gate insulating layer 240 is, for example, high-K dielectric materials, such as $Al_2O_3$, $Ta_2O_5$, $Y_2O_3$, $HfSiO_4$, $HfO_2$, $La_2O_3$, $ZrO_2$, $SrTiO_3$, $ZrSiO_4$ or a combination thereof.

Further, the fin-type field effect transistor 300 in this embodiment also includes a plurality of insulating structures 304 configured in the trenches 303 of the semiconductor substrate 302 for electrically insulating the semiconductor substrate 302 from the gate strip 320 formed thereon. In this case, the material of the insulating structures 304 may be oxide. It should be noted that in each fin-type semiconductor structure 310, the bottom surface of the blocking region 314 and the top surface of the insulating structures 304 are at the same horizontal, but the invention is not limited hereto. In other embodiments, the bottom surface of the blocking region 314 may be lower than the top surface of the insulating structures 304 and the top surface of the blocking region 314 is higher than the top surface of the insulating structures 304.

Additionally, the fin-type field effect transistor 300 can further includes a fin-type semiconductor structure 340 formed with the fin-type semiconductor structures 310 at the same time. The fin-type semiconductor structure 340 is doped only once with the first type dopant, so that the block region 314 is not exist therein. Accordingly, in the fin-type field effect transistor 300, when the gate strip 320 is supplied with a voltage larger than the threshold voltage of the channel region 312, there is only the channel region 312 can be the path provided for the electric carriers moving from source structure 316 toward the drain structure 318 in each fin-type semiconductor structure 310 but the all portions of the fin-type semiconductor structure 340 higher than the top surface of the insulating structure 304 can be the path provided for the electric carriers moving from source structure 316 toward the drain structure 318. That is, in the fin-type field effect transistor 300, the channel widths provided by the fin-type semiconductor structures 310 are relative to the height C1 and the height C2 of the channel regions 312 and the channel width provided by the fin-type semiconductor structure 340 is relative to the height C3 of the portion higher than the top surface of the insulating structures 304.

It should be noted that although the fin-type field effect transistor 300 shown in FIG. 3A and FIG. 3B is tri-gate fin-type field effect transistor, but the invention is not limited hereto. In double-gate fin-type field effect transistor, the trenches 303 also can be formed on the semiconductor substrate 302 and therefore the fin-type semiconductor structures can be taken shape between the adjacent trenches 303.

In summary, the fin-type field effect transistor can include a plurality of fin-type semiconductor structures. The fin-type semiconductor structures have the same height but different depth and height of the blocking regions thereof formed by different doping intensities. Therefore, the fin-type semiconductor structures can provide different channel widths respectively to improve the flexibility of usage of the fin-type field effect transistor.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A fin-type field effect transistor, comprising:
a first fin-type semiconductor structure and a second fin-type semiconductor structure, each of the first and the second fin-type semiconductor structures doped with a first type dopant and having a channel region and a blocking region, wherein the blocking region has a first doping concentration, the channel region has a second doping concentration smaller than the first doping concentration, and the channel region is defined above the blocking region, the first and the second fin-type semiconductor structures having the same height equal to the sum of a height of the channel region and a height of the blocking region, wherein the blocking regions of the first and the second fin-type semiconductor structures have different heights;
a gate strip, substantially parallel to the first and the second fin-type semiconductor structures and covering on the channel regions;
a gate insulating layer, disposed between the gate strip and the first and the second fin-type semiconductor structures;
a semiconductor substrate with a plurality of trenches substantially parallel to each other, wherein each of the first and the second fin-type semiconductor structures is defined between the adjacent trenches; and
a plurality of insulating structures configured within the trenches and the gate strip configured thereon, wherein the top surface of the blocking region is higher than the top surface of each insulating structure, wherein a bottom most surface of the blocking region is coplanar to the top surface of the insulating structures.

2. The fin-type field effect transistor recited in claim 1, further comprising a source structure and a drain structure doped with a second type dopant, wherein each of the first and the second fin-type semiconductor structures is connected between the source structure and the drain structure.

3. The fin-type field effect transistor recited in claim 1, wherein material of the gate strip comprises polysilicon.

4. The fin-type field effect transistor recited in claim 1, wherein the first and the second fin-type semiconductor structures are parallel to each other.

5. The fin-type field effect transistor recited in claim 1, wherein the gate strip is evenly configured on the semiconductor substrate and the trenches being filled therewith and the channel regions being covered.

6. The fin-type field effect transistor recited in claim 1, wherein material of the gate strip comprises metal and material of the gate insulating layer comprises high-K materials.

7. The fin-type field effect transistor recited in claim 1, wherein sidewalls of the blocking region are covered by the gate insulating layer and a bottom of the gate insulating layer is coplanar to the bottom most surface of the blocking region, wherein the gate insulating layer insulates the blocking region from the gate strip.

* * * * *